United States Patent
Godet et al.

(10) Patent No.: US 8,835,287 B2
(45) Date of Patent: Sep. 16, 2014

(54) METHOD OF IMPLANTING A WORKPIECE TO IMPROVE GROWTH OF A COMPOUND SEMICONDUCTOR

(75) Inventors: Ludovic Godet, Boston, MA (US); Morgan D. Evans, Manchester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 219 days.

(21) Appl. No.: 13/468,744

(22) Filed: May 10, 2012

(65) Prior Publication Data

US 2012/0286285 A1 Nov. 15, 2012

Related U.S. Application Data

(60) Provisional application No. 61/486,015, filed on May 13, 2011.

(51) Int. Cl.
*H01L 21/00* (2006.01)
*H01L 21/02* (2006.01)
*H01L 21/266* (2006.01)
*H01L 21/223* (2006.01)
*H01L 29/267* (2006.01)
*H01L 21/265* (2006.01)

(52) U.S. Cl.
CPC ........ *H01L 21/0237* (2013.01); *H01L 21/0254* (2013.01); *H01L 21/266* (2013.01); *H01L 21/2236* (2013.01); *H01L 21/02647* (2013.01); *H01L 29/267* (2013.01); *H01L 21/02639* (2013.01); *H01L 21/26533* (2013.01); *H01L 21/265* (2013.01)
USPC ............................................ 438/506; 257/76

(58) Field of Classification Search
USPC ............................................. 257/76; 438/506
See application file for complete search history.

(56) References Cited

U.S. PATENT DOCUMENTS

| | | | |
|---|---|---|---|
| 7,816,764 B2 | 10/2010 | Marchand et al. | |
| 2010/0065865 A1* | 3/2010 | Byun et al. ...................... | 257/94 |
| 2010/0323508 A1 | 12/2010 | Adibi et al. | |

OTHER PUBLICATIONS

Zhang, Baoshun, et al., High-performance III-nitride blue LEDs grown and fabricated on patterned Si substrates, Journal of Crystal Growth, Jan. 2007, pp. 725-730, vol. 298, Elsevier, Amsterdam, The Netherlands.

Hiramatsu, Kazumasa, Epitaxial lateral overgrowth techniques in group III nitride epitaxy, Journal of Physics: Condensed Matter 13, 2001, pp. 6961-6975, Institute of Physics Publishing, United Kingdom.

Kim, Bumjoon, et al., Epitaxial Lateral Overgrowth of GaN on Si (111) Substrates Using High-Dose, N+ Ion Implantation, Chemical Vapor Deposition, 2010, pp. 80-84, vol. 16, Nos. 1-3, Wiley-Vch Verlag, Weinheim, Germany.

* cited by examiner

*Primary Examiner* — Douglas Menz (57) ABSTRACT

A workpiece is implanted to improve growth of a compound semiconductor, such as GaN. This workpiece may be implanted such that the workpiece has a dose at a center different from a dose at a periphery. This workpiece also may be implanted one or more times to form a pattern of lines, which may be a grid, a series of circles, or other shapes. The distance between certain pairs of lines may be different across the workpiece.

18 Claims, 6 Drawing Sheets

METHOD OF IMPLANTING A WORKPIECE TO IMPROVE GROWTH OF A COMPOUND SEMICONDUCTOR

CROSS-REFERENCE TO RELATED APPLICATIONS

This claims priority to the provisional patent application entitled "Non-Uniform Implantation for Workpiece Engineering or Epitaxial Layer Overgrowth," filed May 13, 2011 and assigned U.S. App. No. 61/486,015, the disclosure of which is hereby incorporated by reference.

FIELD

This invention relates to ion implantation and, more particularly, to ion implantation to improve the quality of a layer grown on a workpiece.

BACKGROUND

Ion implantation is a standard technique for introducing material into a workpiece. A desired implant material is ionized in an ion source, the ions are accelerated to form an ion beam of prescribed energy, and the ion beam is directed at the surface of the workpiece. The energetic ions in the ion beam penetrate into the bulk of the workpiece material and affect both the surface and depth of the workpiece material under certain conditions.

Gallium nitride (GaN) a material commonly grown on workpieces. GaN is becoming more important for use in light-emitting diodes (LEDs), power transistors, and solid state lasers. The ability to grow high-quality GaN is one limiting factor to improving the quality and lowering the cost of these devices. One method of improving the quality of epitaxially-grown. GaN is known as epitaxial layer overgrowth (ELOG). For ELOG, a layer of GaN is grown, hard mask windows of $SiO_2$ or $Si_xN_y$ are deposited, and then the high-quality GaN is grown. In some instances, deposition of the hard mask requires removal of the workpiece from the MOCVD tool and then reintroduction of the workpiece to the MOCVD tool after a lithography step, photoresist application, deposition, and photoresist removal. This particular process is cumbersome and costly. Repeated ELOG sequences add even more cost.

ELOG of GaN on silicon, sapphire, SiC, AlN, GaN, or other workpieces can be accomplished using implantation instead of $SiO_2$ or $Si_xN_y$ deposition. Previously, photoresist was used to mask part of the silicon workpiece and implantation was performed on the unmasked areas. GaN grew laterally over the implanted areas. However, this process is still fairly complex. The use of photoresist adds extra steps, which increases manufacturing costs. Such implantation also may not account for stresses between the GaN and workpiece. What is needed is a faster, less complex, and lower cost method of growing high-quality compound semiconductors.

SUMMARY

According to a first aspect of the invention, a method of implanting a workpiece is provided. The method comprises implanting a workpiece such that the workpiece has a dose at a center different from a dose at a periphery. A compound semiconductor is grown on the workpiece after the implanting.

According to a second aspect of the invention, a method of implanting a workpiece is provided. The method comprises implanting a workpiece to form at least three implanted regions that are adjacent. A first distance between a first implanted region and a second implanted region is different from a second distance between the second implanted region and a third implanted region. A compound semiconductor is grown on the workpiece after the implanting.

According to a third aspect of the invention, an implanted workpiece is provided. The implanted workpiece comprises a workpiece with a plurality of implanted regions. There are discrete regions between the implanted regions that are surrounded by these implanted regions. A compound semiconductor layer is disposed on the workpiece.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments are described herein in connection with formation of a compound semiconductor such as GaN, but these embodiments also may be used with other III/V compound semiconductors, II/VI compound semiconductors, or other materials known to a person skilled in the art. Other ion implantation systems known to those skilled in the art that can focus an ion beam or that can implant particular regions of a workpiece with or without a mask on or above the workpiece also may be used. While LEDs are specifically disclosed, other devices also may benefit from the embodiments described herein. The workpieces herein may be silicon, sapphire, AlN, GaN, other compound semiconductors, or other materials and may include additional layers on the workpiece surfaces. Thus, the invention is not limited to the specific embodiments described below.

Implantation of a non-uniform pattern on the workpiece may be used to compensate for any stress and, thus, any resulting bowing, of the workpiece due to the lattice and thermal mismatch between the workpiece and the deposited layer. If for example, GaN is grown on a silicon or sapphire workpiece, eventually the mismatch will lead to stress between the GaN and the workpiece. The relaxation of any of this stress ("unbowing") may lead to cracking of the GaN, which can damage one or more devices or render a workpiece partially or totally unusable. If the workpiece remains bowed, then the subsequent photoresist or other processing steps may be incorrect. The workpiece can even break if there is too much bowing.

A non-uniform implantation compensates for stress created on or in a workpiece that leads to this bowing. The non-uniform implant can locally create more stress at the edge than in the center of the workpiece, for example. Other patterns can create stress in other parts of the workpiece. The implant pattern that affects stress may be tailored to the growth pattern or materials. One potential mechanism that enables this compensation for stress is that the change in density of ELOG counteracts the change in strain in the GaN as the workpiece bows. Of course, other mechanisms are possible.

FIGS. 1A-1B are top perspective views of a first embodiment of implantation into a workpiece. Adjusting the dose to be either higher or lower may affect the growth rate of the GaN. This may compensate for non-uniform or radial GaN growth in an MOCVD tool. Implanted regions 103 are formed in the workpiece 100 using ion implantation. These implanted regions 103 are illustrated as lines in FIG. 1A, but other shapes are possible. In the embodiment of FIGS. 1A-1B, the workpiece 100 may be rotated 90° with respect to the ion beam between the implant step that results in the implanted regions 103 of FIG. 1A and the implanted regions 103 of FIG. 1B. This rotation may be used to form a grid pattern of implanted regions 103 such that the various lines of the implanted regions 103 overlap. Of course, other rotation amounts are possible, such as 45° or 60°. This forms a series of discrete regions between the implanted regions 103 that are not implanted or that are implanted less than the implanted regions 103. Such discrete regions may be totally surrounded by the implanted regions 103. ELOG may be performed on the workpiece 100 after the implanted regions 103 are formed.

The dose varies across the workpiece such that there is a higher dose in the implanted regions 103 at the center of the workpiece 100 than the implanted regions 103 at the periphery of the workpiece 100. This is illustrated by the curve representing dose across dimension 140 and dimension 141. Of course, the opposite may be true such that there is a lower dose in the implanted regions 103 at the center of the workpiece 100. This is illustrated in FIGS. 2A-2B. In this embodiment, there is a higher dose in the implanted regions 103 at the periphery of the workpiece 100 than the implanted regions 103 at the center of the workpiece 100. The dose can vary across a single implanted region 103, such as from one end of a linear implanted region 103 to the other end. The dose also may be constant for a particular implanted region 103, but some implanted regions 103 may have a different dose from a neighboring implanted region 103.

For the embodiments of FIGS. 1A-1B and FIGS. 2A-2B, the dose or dwell time during implant at each implanted region 103 may vary to make the dose pattern illustrated. For example, a pulsed DC ion beam may be turned on when and where an implant is needed in the workpiece 100. In another example, a focused spot beam with scanning in two perpendicular directions may be used.

In another embodiment, a patterned implant specific to the desired implanted regions 103 may be able to perform the implant in one pass without multiple implants or without rotation of the workpiece 100. An extraction plate may be modified to form such a patterned implant. This may modulate the dose across the workpiece 100 or the fraction of the workpiece 100 being implanted as the workpiece 100 or ion beam is scanned to obtain the desired implant pattern in one pass or in multiple passes without rotating the workpiece 100.

A non-uniform patterned implant may be performed without a mask in one embodiment, which reduces complexity and the number of process steps. For instance, the plasma processing apparatus having a plasma sheath modifier of FIG. 6 may be used. The scan speed, pulse duration, RF power, or pressure all may be changed during processing to affect the dose implanted into a workpiece 100.

In an alternate embodiment, a mask with one aperture is provided above or a distance from the workpiece 100. The workpiece 100 is translated with respect to this mask such that the implanted regions 103 are formed as seen in FIGS. 1A and 2A. The workpiece 100 may be rotated with respect to an ion beam or mask between implants if additional implants are performed.

In a second alternate embodiment, a mask with multiple apertures that match the implanted regions 103 illustrated in FIG. 1A or 2A is provided above or a distance from the workpiece 100. The ion beam may be scanned with respect to the mask or workpiece 100 using a varying dose or with a varying dwell time over the various apertures to form the desired dose pattern.

In a third alternate embodiment, no mask is used. An ion beam is directed across the workpiece 100. The scan speed of the ion beam is slowed when the ion beam forms the implanted regions 103 illustrated in FIG. 1A or 1B or in FIG. 2A or 2B. The dwell time may be adjusted between the various implanted regions 103 to form the desired dose pattern. The scan speed is then increased as the ion beam passes over the areas between the implanted regions 103. The dose in these areas between the implanted regions 103 may be negligible or configured to not affect later growth steps. The workpiece 100 may be rotated between multiple implants in one particular embodiment.

In yet another alternate embodiment, the extraction plate may have multiple holes with constant or varied speed of scanning of the workpiece 100 to make linear implanted regions 103. Each hole in the extraction plate corresponds to one of these lines. The holes in the extraction plate may be spaced uniformly or non-uniformly.

Figure 1:
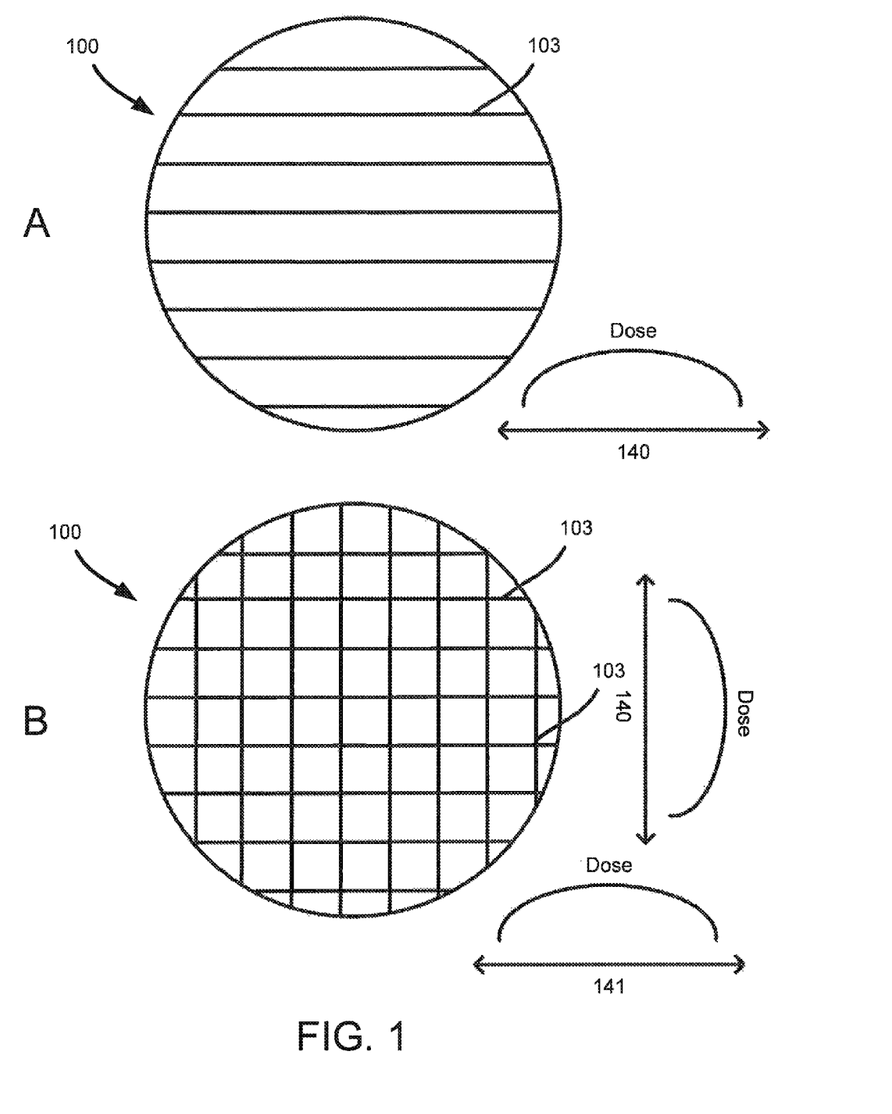
FIGS. 1A-1B are top perspective views of a first embodiment of implantation into a workpiece.
Figure 2:
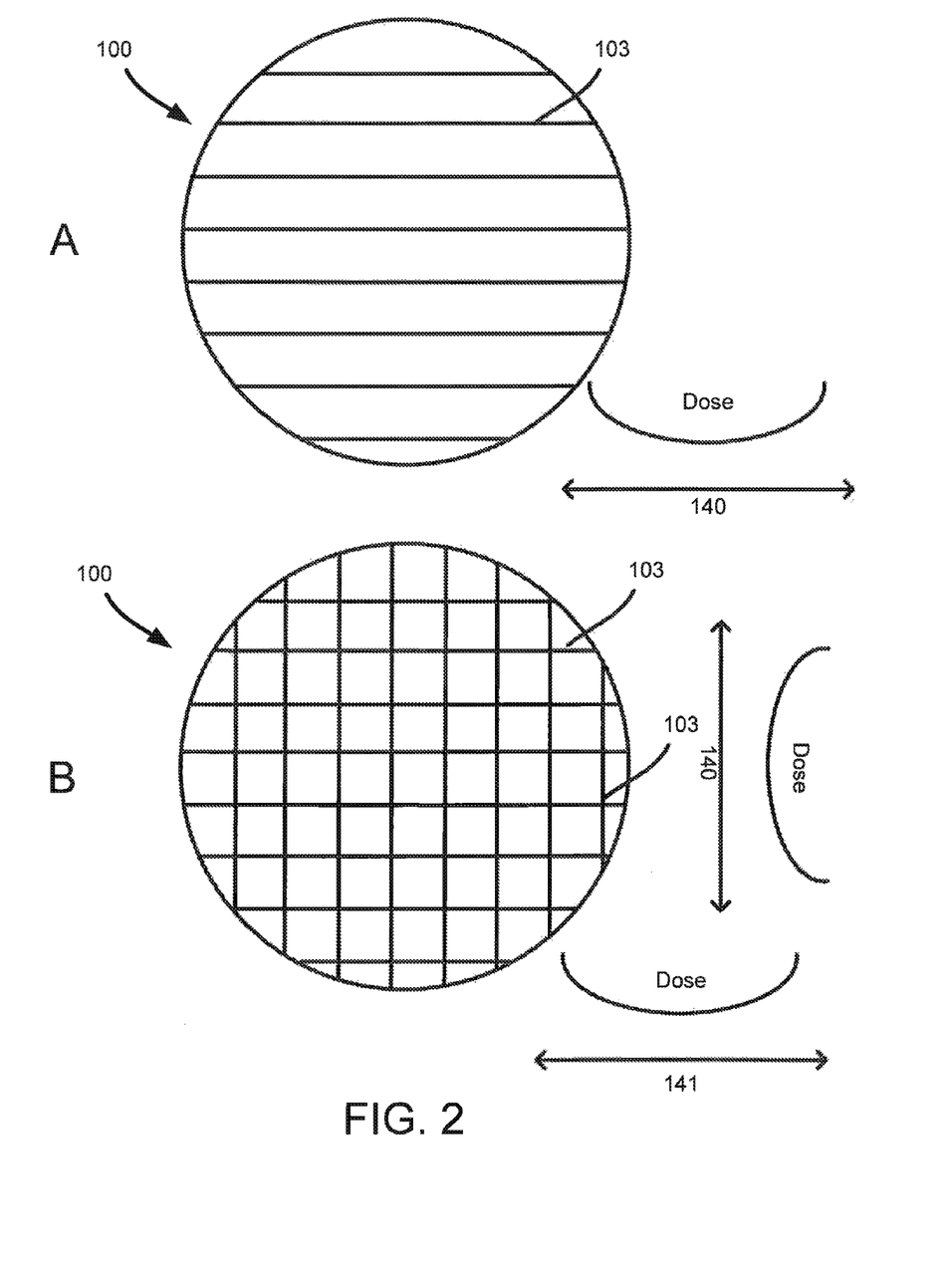
FIGS. 2A-2B are top perspective views of a second embodiment of implantation into a workpiece.
Figure 3:
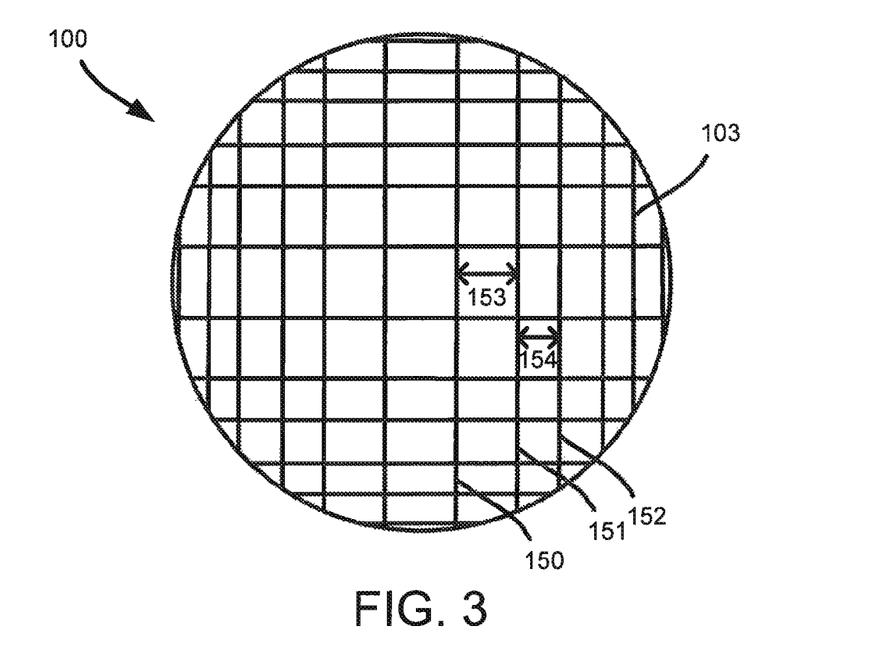
FIG. 3 is a top perspective view of a third embodiment of implantation into a workpiece.

FIG. 3 is a top perspective view of a third embodiment of implantation into a workpiece. The implant system may be programmed to implant lines at various steps up and down the workpiece 100 before rotation and during subsequent implantation of the workpiece 100. In FIG. 1 the implanted regions 103 on the workpiece 100 are spaced apart by different distances. The implanted regions 103 may be formed in any manner used in the embodiments of FIGS. 1A-1B and FIGS. 2A-2B. In this embodiment, larger growth areas are located in the center of the workpiece 100, as represented by the regions between the implanted regions 103. Of course, other implant patterns than that illustrated in FIG. 3 are possible. In this embodiment, a first implanted region 150 is spaced apart from an adjacent second implanted region 151 by a first distance 153. The second implanted region 151 is spaced apart from an adjacent third implanted region 152 by a second distance 154. The first distance 153 and second distance 154 are different. If the workpiece 100 is rotated 90°, for example, and additional implanted regions 103 are added to form a grid as seen in FIG. 3, then the non-implanted regions between the implanted regions 103 vary in size across the workpiece 100.

Figure 4:
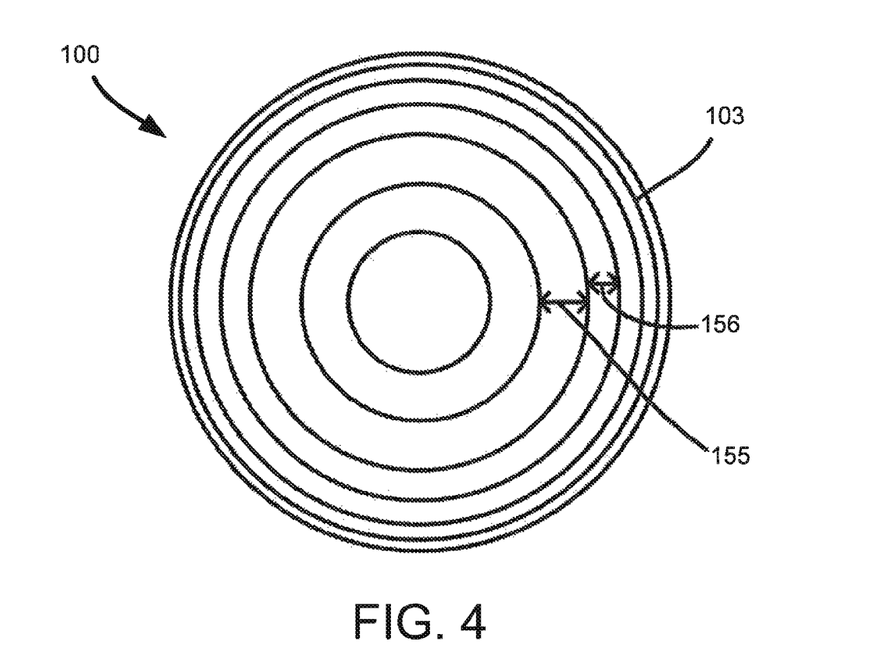
FIG. 4 is a top perspective view of a fourth embodiment of implantation into a workpiece.

FIG. 4 is a top perspective view of a fourth embodiment of implantation into a workpiece. In this embodiment, the implanted regions 103 are circular instead of linear. These may be formed by rotating the workpiece 100 360° with respect to an ion beam that implants at least one point on the workpiece 100. Implants occurring at multiple points also are possible. The 360° rotation will turn this at least one point into an implanted region 103 with a circular shape. The various adjacent implanted regions 103 in FIG. 4 are spaced apart by different distances similar to FIG. 3, such as the first distance 155 and second distance 156.

While specific implant patterns are illustrated, other variations are possible. The implant pattern may be circles, squares, polygons, dots, or other shapes of uniform or varying dimension or spacing. Thus, the embodiments are not meant to be limited to what is illustrated in the figures.

Figure 5A:
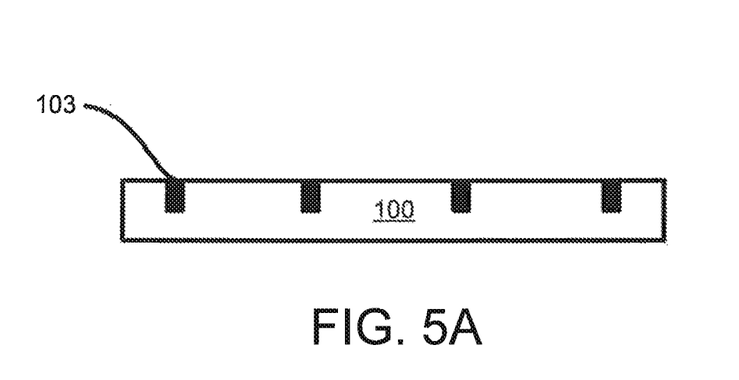
FIG. 5A-5C illustrate an embodiment of an implantation process.
Figure 5B:
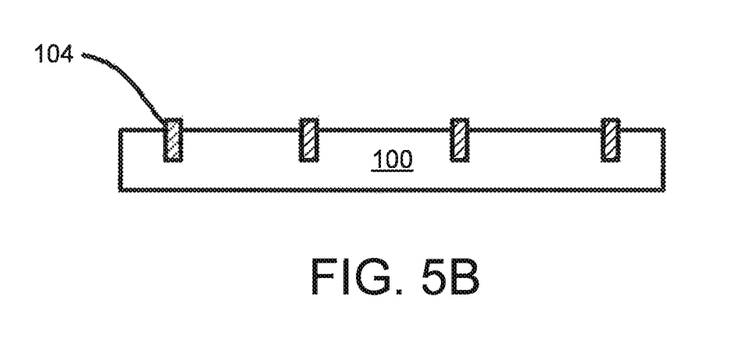
Figure 5C:
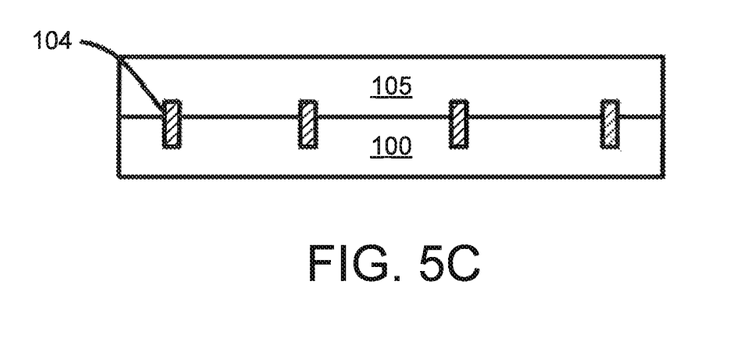

FIG. 5 illustrates an embodiment of an implantation process. The embodiment of FIG. 5 may be applied to form the implanted workpieces of FIGS. 1-4. In FIG. 5A, oxygen is implanted into a workpiece 100, which may be silicon. This implanted oxygen forms the implanted regions 103. These implanted regions 103 may have a pattern similar to the embodiments illustrated in FIGS. 1-4. The patterned implant may use the plasma processing apparatus having a plasma sheath modifier of FIG. 6 or some other method. The implanted regions 103 do not cover the entirety of the workpiece 100 surface, as illustrated in FIGS. 1-4. After the oxygen implant, the workpiece 100 is annealed in a nitrogen ambient to create $SiO_2$ regions 104 in the surface of the workpiece 100. These $SiO_2$ regions 104 are then used for GaN growth during ELOG, which forms the GaN layer 105. The implanted regions 103 may be several mm to several μm in dimensions. For example, the implanted regions 103 may be between 3 to 50 μm. Different $SiO_2$ regions 104 across the workpiece will compensate for stress induced by lattice and thermal mismatch. This will help control threading dislocations, cracking, and bowing of compound semiconductor stacks or the GaN layer 105 on the workpiece 100.

In a second embodiment, the workpiece 100 may be sapphire or another material and is selectively implanted with oxygen to form implanted regions 103. The GaN layer 105 may be formed on the workpiece 100 after an anneal.

In a third embodiment, the workpiece 100 is sapphire or SiC and silicon is implanted to form the implanted regions 103. During an anneal in an oxygen atmosphere the $SiO_2$ regions 104 are formed. A GaN layer 105 is then formed on the workpiece 100 using ELOG.

In a fourth embodiment, nitrogen is used to form the implanted regions 103 in a workpiece 100. SiN regions are formed during the anneal instead of $SiO_2$ regions 104. A GaN layer 105 is then formed on the workpiece 100 using ELOG.

In a fifth embodiment, germanium is used to form the implanted regions 103 in the workpiece 100. SiGe regions are formed during the anneal instead of $SiO_2$ regions 104. A GaN layer 105 is then formed on the workpiece 100 using ELOG. The presence of SiGe may cause some strain in the workpiece 100, which may benefit the growth of the GaN layer 105 during ELOG. For example, the GaN layer 105 may grow above the implanted regions 103 at a different rate than the non-implanted regions.

In a sixth embodiment, carbon is used to form the implanted regions 103 in the workpiece 100. SiC or amorphous regions containing carbon are formed during implantation or anneal instead of the of $SiO_2$ regions 104. A GaN layer 105 is then formed on the workpiece 100 using ELOG. The carbon or crystal structure of the implanted regions 103 may prevent or reduce growth of the GaN layer 105 over the implanted regions 103. These implanted regions 103 may not shrink during an anneal.

In a seventh embodiment, a mixture of ions may be implanted into the workpiece. For example, nitrogen and oxygen may be used to form the implanted regions 103. Other combinations of species disclosed herein or combinations of species disclosed herein with other species are possible.

Figure 6:
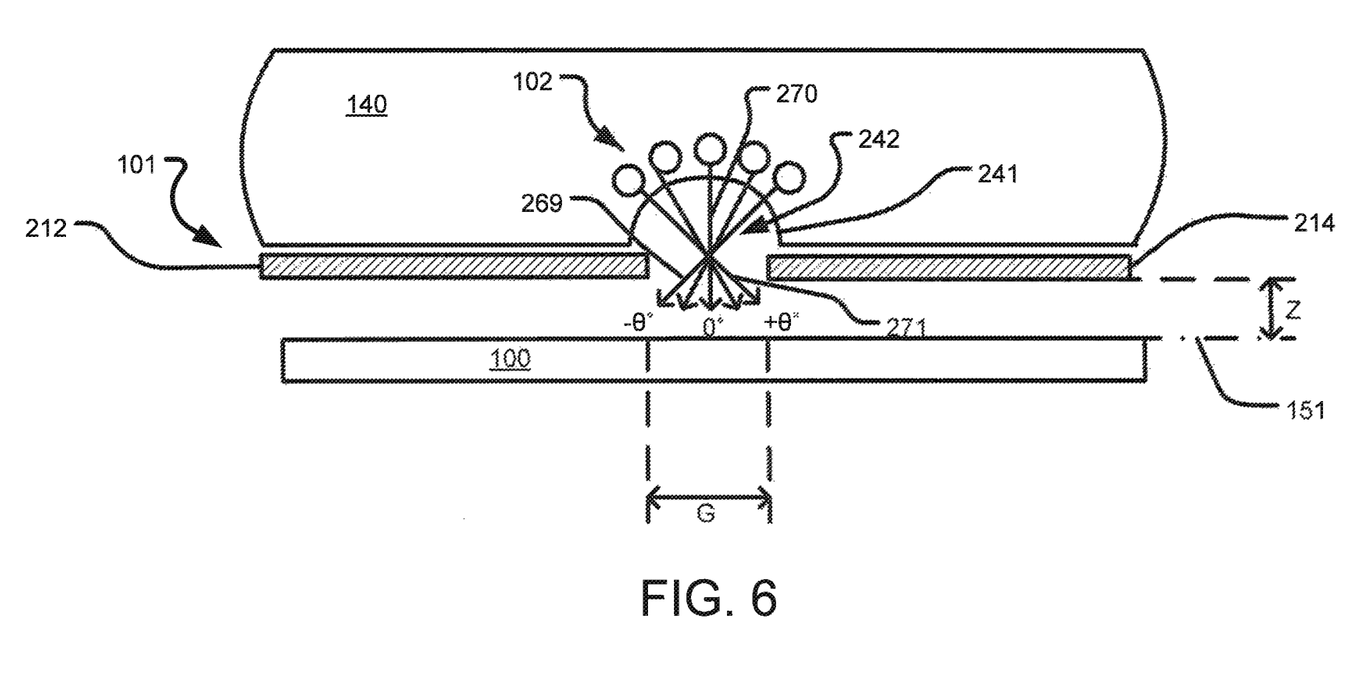
FIG. 6 is a block diagram of a plasma processing apparatus having a plasma sheath modifier.

FIG. 6 is a block diagram of a plasma processing apparatus having a plasma sheath modifier. The plasma 140 is generated as is known in the art. This plasma 140 is generally a quasi-neutral collection of ions and electrons. The ions typically have a positive charge while the electrons have a negative charge. The plasma 140 may have an electric field of for example, approximately 0 V/cm in the bulk of the plasma 140.

In a system containing the plasma 140, ions 102 from the plasma 140 are attracted toward a workpiece 100. These ions 102 may be attracted with sufficient energy to be implanted into the workpiece 100. The plasma 140 is bounded by a region proximate the workpiece 100 referred to as a plasma sheath 242. The plasma sheath 242 is a region that has fewer electrons than the plasma 140. Hence, the differences between the negative and positive charges cause a sheath potential in the plasma sheath 242. The light emission from this plasma sheath 242 is less intense than the plasma 140 because fewer electrons are present and, hence, few excitation-relaxation collisions occur. Thus, the plasma sheath 242 is sometimes referred to as "dark space."

The plasma sheath modifier 101 is configured to modify an electric field within the plasma sheath 242 to control a shape of a boundary 241 between the plasma 140 and the plasma sheath 242. Accordingly, ions 102 that are attracted from the plasma 140 across the plasma sheath 242 may strike the workpiece 100 at a large range of incident angles. This plasma sheath modifier 101 may be referred to as, for example, a focusing plate or sheath engineering plate.

In the embodiment of FIG. 6, the plasma sheath modifier 101 includes a pair of panels 212 and 214 defining an aperture there between having a horizontal spacing (G). The panels 212 and 214 may be an insulator, semiconductor, or conductor. In other embodiments, the plasma sheath modifier 101 may include only one panel or more than two panels. The panels 212 and 214 may be a pair of sheets having a thin, flat shape. In other embodiments, the panels 212 and 214 may be other shapes such as tube-shaped, wedge-shaped, and/or have a beveled edge proximate the aperture. The panels 212 and 214 also may be positioned a vertical spacing (Z) above the plane 151 defined by the front surface of the workpiece 100. In one embodiment, the vertical spacing (Z) may be about 1.0 to 10.0 mm.

Ions 102 may be attracted from the plasma 140 across the plasma sheath 242 by different mechanisms. In one instance, the workpiece 100 is biased to attract ions 102 from the plasma 140 across the plasma sheath 242. In another instance, a plasma source that generates the plasma 140 and walls surrounding the plasma 140 are biased positively and the workpiece 100 may be grounded. The biasing may be pulsed in one particular embodiment. In yet another instance, electric or magnetic fields are used to attract ions 102 from the plasma 140 toward the workpiece 100.

Advantageously, the plasma sheath modifier 101 modifies the electric field within the plasma sheath 242 to control a shape of the boundary 241 between the plasma 140 and the plasma sheath 242. The boundary 241 between the plasma 140 and the plasma sheath 242 may have a convex shape relative to the plane 151 in one instance. When the workpiece 100 is biased, for example, the ions 102 are attracted across the plasma sheath 242 through the aperture between the panels 212 and 214 at a large range of incident angles. For instance, ions 102 following trajectory path 271 may strike the workpiece 100 at an angle of +θ° relative to the plane 151. Ions 102 following trajectory path 270 may strike the workpiece 100 at about an angle of 0° relative to the same plane 151. Ions 102 following trajectory path 269 may strike the workpiece 100 an angle of −θ° relative to the plane 151. Accordingly, the range of incident angles may be between +θ° and −θ° centered about 0°. In addition, some ion trajectories paths such as paths 269 and 271 may cross each other. Depending on a number of factors including, but not limited to, the horizontal spacing (G) between the panels 212 and 214, the vertical spacing (Z) of the panels 212 and 214 above the plane 151, the dielectric constant of the panels 212 and 214, or other process parameters of the plasma 140, the range of incident angles (θ) may be between +60° and −60° centered about 0°.

Figure 7:
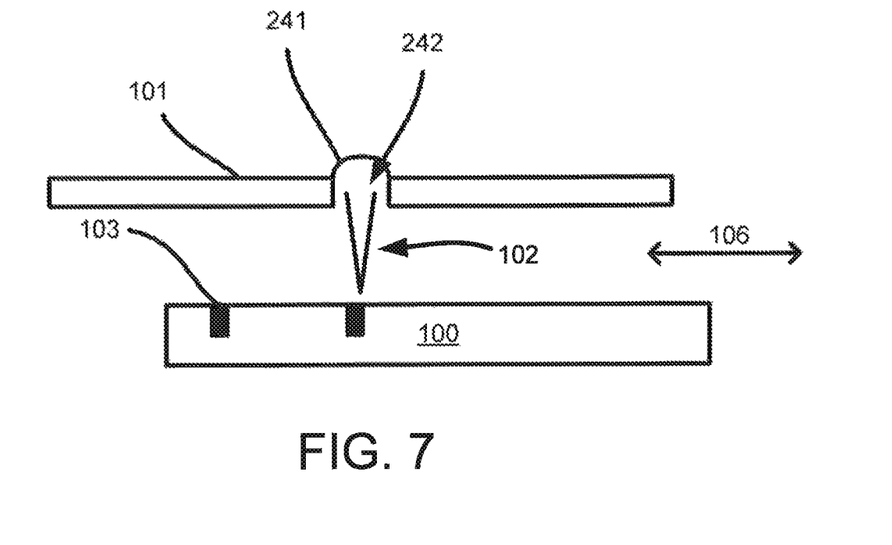
FIG. 7 is a side view of an embodiment of selective ion implantation.

FIG. 7 is a side view of an embodiment of selective ion implantation. Implanted regions 103 are formed in the workpiece 100 using the ions 102. The workpiece 100 is scanned with respect to the plasma sheath modifier 101 or ions 102, as illustrated by the arrow 106. This may involve moving the plasma sheath modifier 101, workpiece 100, or both. The scanning may be in one dimension or two dimensions. In one particular embodiment, the workpiece 100 is biased when the ions 102 implant the implanted regions 103. The bias scheme is adjusted to produce the desired pattern of implanted regions 103. Thus, the workpiece 100 is not biased when the ions 102 would implant between the implanted regions 103. This eliminates or reduces ions 102 from impacting between the implanted regions 103. In this manner, the implanted regions 103 may be formed without a mask or photoresist layer on the workpiece 100. Alignment, lithography, or photoresist removal steps may be eliminated.

The location of the implanted regions 103 may be carefully controlled because spacing of the implanted regions 103 may affect growth of the GaN or another compound semiconductor during growth or ELOG. This spacing may be optimized for improved compound semiconductor growth.

The dose rate and focus of the ions 102 can be varied to form the implanted regions 103. If the workpiece 100 is scanned, then the ions 102 may be switched on and off to form the implanted regions 103, the dose of the ion 102 may be adjusted to reduce implantation between the implanted regions 103, or the ions 102 may be focused when implanting the implanted regions 103. If the ions 102 are focused when implanting the implanted regions 103, the ions 102 may be less focused over other parts of the workpiece 100, which reduces implantation between the implanted regions 103.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of implanting a workpiece comprising:
   performing a first ion implant into said workpiece to form a first plurality of lines, such that a line at a center of said workpiece has a dose different from a dose of a line at a periphery; and
   growing a compound semiconductor on said workpiece after said implanting.

2. The method of claim 1, wherein said first ion implant uses ions comprising oxygen, silicon, nitrogen, germanium, or carbon.

3. The method of claim 1, wherein said dose of a line at said center is higher than said dose of a line at said periphery.

4. The method of claim 1, wherein said dose of a line at said center is lower than said dose of a line at said periphery.

5. The method of claim 1, further comprising:
   rotating said workpiece after performing said first ion implant; and
   performing a second ion implant into said workpiece to form a second plurality of lines, such that a line of said second plurality at a center of said workpiece has a dose different from a dose of a line of said second plurality at a periphery, thereby forming a grid with said first plurality of lines and said second plurality of lines;
   wherein said rotating and said second ion implant are performed prior to said growing.

6. A method of implanting a workpiece comprising:
   implanting a workpiece to form at least three implanted regions that are adjacent, wherein a first distance between a first implanted region and a second implanted region is different from a second distance between said second implanted region and a third implanted region; and
   growing a compound semiconductor on said workpiece after said implanting.

7. The method of claim 6, wherein said implanting comprises:
   performing a first ion implant into said workpiece to form a first plurality of lines;
   rotating said workpiece; and
   performing a second ion implant into said workpiece to form a second plurality of lines thereby forming a grid with said first plurality of lines and said second plurality of lines.

8. The method of claim 6, wherein said implanted regions are lines.

9. The method claim 8, wherein said lines form a grid.

10. The method of claim 6, wherein said implanted regions are circles.

11. The method of claim 6, wherein said implanting uses ions comprising oxygen, silicon, nitrogen, germanium, or carbon.

12. An implanted workpiece comprising:
    a workpiece with a plurality of implanted regions, said implanted regions comprising a plurality of lines forming a grid with a plurality of discrete regions between said implanted regions that are surrounded by said implanted regions; and
    a compound semiconductor layer disposed on said workpiece.

13. The implanted workpiece of claim 12, wherein said implanted regions have a dose at a center of said workpiece and a dose at a periphery of said workpiece, said dose of said implanted regions at said center of said workpiece being higher than said dose of said implanted regions at said periphery of said workpiece.

14. The implanted workpiece of claim 12, wherein said implanted regions have a dose at a center of said workpiece and a dose at a periphery of said workpiece, said dose of said implanted regions at said center of said workpiece being lower than said dose of said implanted regions at said periphery of said workpiece.

15. The implanted workpiece of claim 12, wherein said implanted regions comprise at least a first implanted region, second implanted region, and third implanted region that are adjacent, wherein a first distance between said first implanted region and said second implanted region is different from a second distance between said second implanted region and said third implanted region.

16. The implanted workpiece of claim 12, wherein said implanted regions comprise oxygen, silicon, nitrogen, germanium, or carbon.

17. The implanted workpiece of claim 12, wherein said workpiece comprises silicon, sapphire, or SiC.

18. The implanted workpiece of claim 12, wherein said compound semiconductor comprises GaN.

* * * * *